United States Patent [19]

Pfaff

[11] Patent Number: 4,767,983
[45] Date of Patent: Aug. 30, 1988

[54] TEST FIXTURE FOR ELECTRONIC DEVICE PACKAGES

[76] Inventor: Wayne K. Pfaff, 309 Steeplechase, Irving, Tex. 75062

[21] Appl. No.: 421

[22] Filed: Jan. 5, 1987

[51] Int. Cl.$^4$ .............................................. G01R 31/02
[52] U.S. Cl. ........................... 324/158 F; 324/73 PC
[58] Field of Search ............ 324/158 F, 73 PC, 73 R; 200/16 C, 16 D, 11 DA; 439/78, 79, 80

[56] References Cited

U.S. PATENT DOCUMENTS

| 2,853,565 | 9/1958 | Arthur et al. | 200/16 D |
| 4,152,644 | 5/1979 | Lockhart, Jr. | 324/158 F |
| 4,468,616 | 8/1984 | Yoshizaki | 324/158 F |
| 4,514,786 | 4/1985 | Charruau | 324/73 PC |
| 4,636,725 | 1/1987 | Santomango et al. | 324/158 F |

Primary Examiner—Ernest F. Karlsen
Attorney, Agent, or Firm—Kanz, Scherback Timmons

[57] ABSTRACT

Disclosed is a test fixture for connecting a plurality of electronic device packages to test apparatus. The fixture includes a plurality of test sockets and means to selectively interconnect the socket leads with external test apparatus. The test fixture may be used as a burn-in board as well as a test, transport and storage medium to reduce individual handling of electronic device packages.

10 Claims, 11 Drawing Sheets

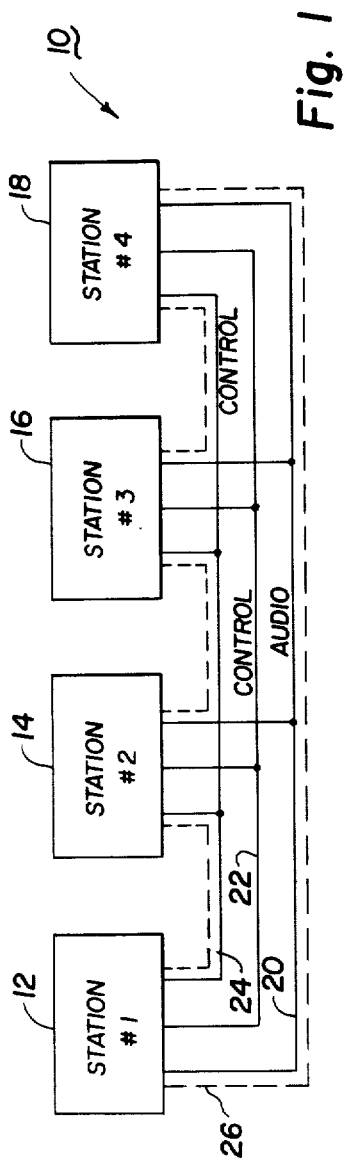
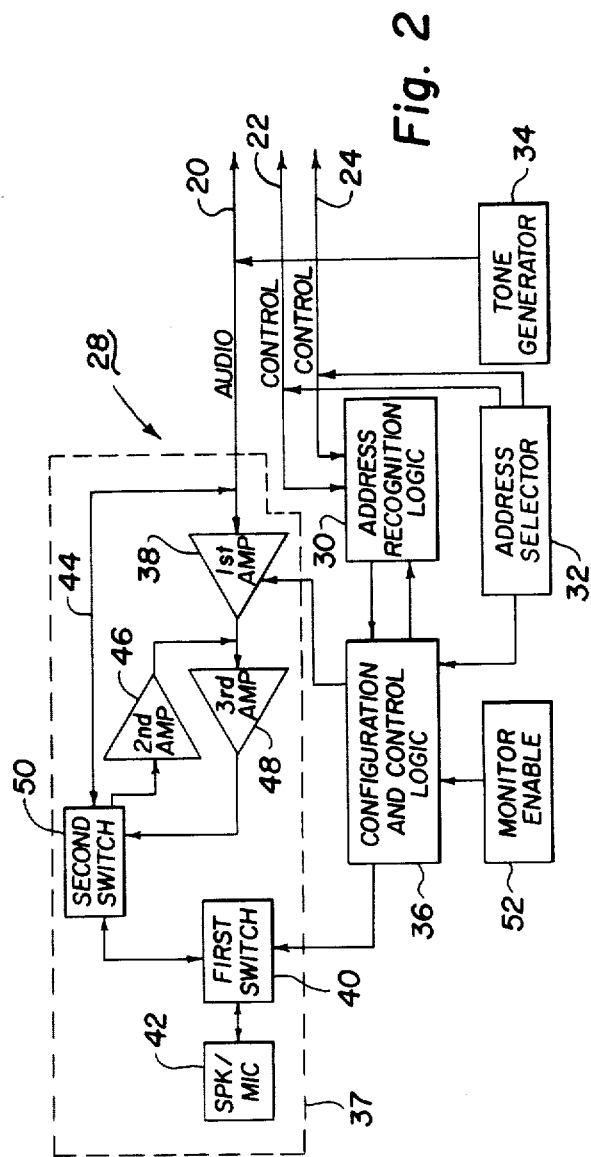

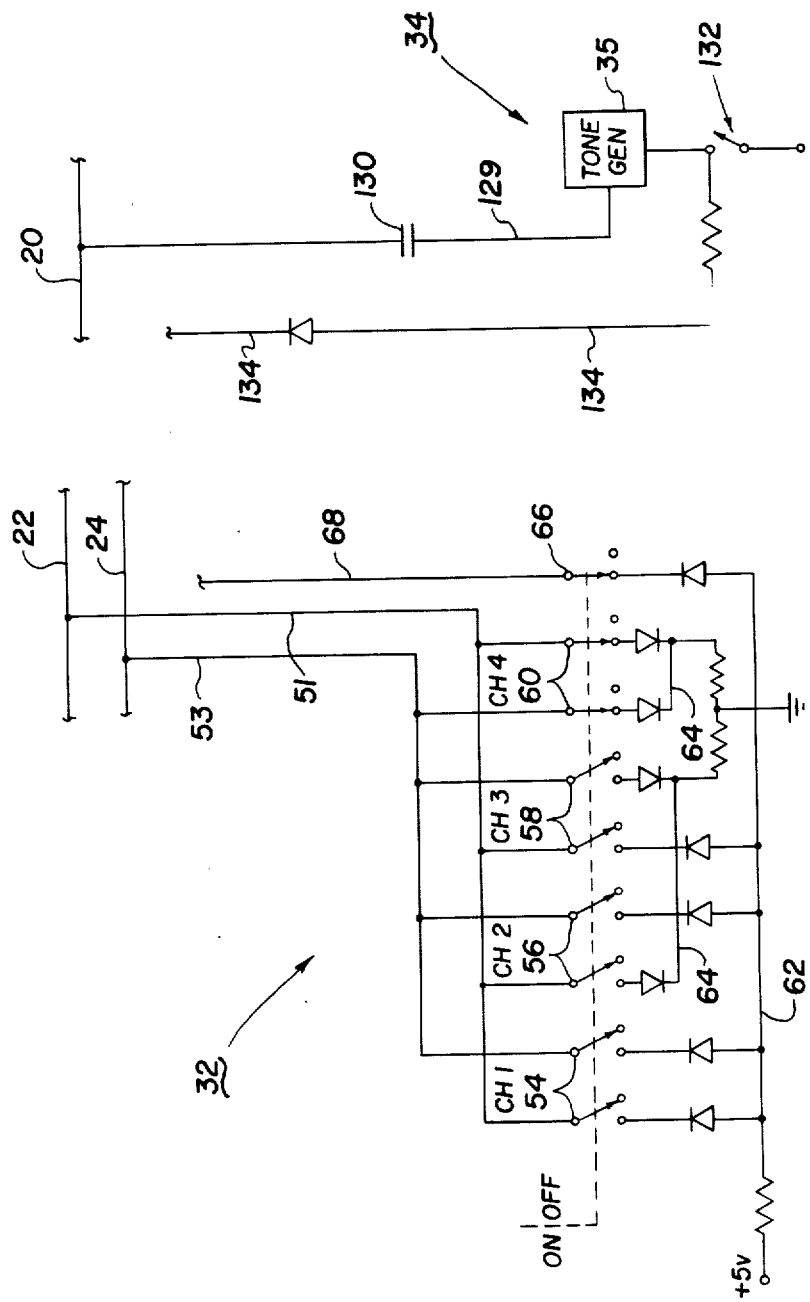

TEST FIXTURE FOR ELECTRONIC DEVICE PACKAGES

This invention relates generally to electronic test apparatus. More particularly, it relates to fixtures for use with electronic test apparatus for electronic components.

In the electronics industry it is frequently necessary or desirable to test all or a substantial portion of the manufactured output of a semiconductor device product line. Standard testing procedures include individually mounting a plurality of semiconductor devices on a test board known as a burn-in board and simultaneously subjecting the devices to various environmental and electrical stresses. After the burn-in test is completed the devices are individually unloaded from the burn-in board. Usually the devices are also individually loaded and unloaded on or in one or more other electronic testing apparatus either before or after the burn-in test for electronically testing other characteristics of the devices. Those devices failing the various tests are discarded or classified according to test performance.

It is desirable that the loading and unloading of semiconductor devices from the test apparatus and burn-in boards be accomplished as rapidly and economically as possible. Repeated manual loading and unloading of individual electronic device packages is possible. However, this procedure is slow, labor intensive and therefore expensive. Moreover, semiconductor devices must be handled carefully to avoid damage to the device and its package. Due to the fragility of semiconductor devices and the electronic device packages, it is also desirable to handle the electronic device packages as infrequently as possible and to provide protection during the handling, transportation and testing of the semiconductor devices contained in the electronic device packages. For instance, the leads on an electronic device package may be damaged or bent while being inserted into a socket on a burn-in board or test apparatus if not aligned correctly with the socket. Even if aligned correctly, the leads may become worn through repeated insertion and removal from a socket.

This invention provides an improved test fixture for testing electronic device packages. The test fixture includes a body preferably constructed at least partially of electrically insulating material. A first printed circuit board is mounted in the body. A plurality of sockets for receiving the electronic device packages is mounted on the first printed circuit board and is accessible through an opening in the fixture body for loading and unloading of the electronic device packages. A second printed circuit board is mounted in the fixture body beneath and parallel with the first printed circuit board and externally accessible for connection to test apparatus. The second printed circuit board is shiftable between two positons with respect to the first printed circuit board. Means are provided to connect the sockets containing the electronic device packages on the first printed circuit board with the second printed circuit board when the second printed circuit board is in one position. This enables a plurality of the electronic device packages to be simultaneously tested by the test apparatus through the external connection of the second printed circuit board. In the other position the first and second printed circuit boards are disconnected and the test fixture, loaded with the electronic device packages, may be transported or stored with the electronic device packages protected from mechanical or electrical damage.

In an alternative embodiment of the invention the second printed circuit board may include a plurality of spaced apertures aligned with the exposed leads of the sockets on the first printed circuit board. One or more probes connected to the external test apparatus may be inserted through an opening in the fixture body and the apertures in the second printed circuit board for contact with the socket leads for testing the electronic devices individually or in various combinations. Furthermore, the second printed circuit board may be omitted and the electronic devices tested through direct contact between the exposed leads of the sockets and one or more probes connected to the external test apparatus inserted through an opening in the fixture body.

The text fixture of the invention may be used to simultaneously connect a plurality of electronic device packages to test apparatus. Since the fixture simultaneously receives a plurality of electronic device packages and provides transport means for transferring the devices between test operations, individual unloading and re-loading into a plurality of test fixtures is eliminated, thus grossly reducing the risk of damage to the device and minimizing handling time and expense.

So that the manner in which the above recited features and advantages of the invention, as well as others which will become apparent to those skilled in the art, are obtained and can be understood in detail, a more particular description of the invention briefly summarized above may be had by reference to the embodiments thereof which are illustrated in the accompanying drawing which forms a part of the specification and in which like numerals depict like parts in the several views. It is noted, however, that the appended drawing illustrates only a preferred embodiment of the invention and is therefore not to be considered limiting of its scope, for the invention may admit to other equally effective embodiments.

FIG. 7 is an exploded isometric view of the test fixture of FIG. 6.

Figure 1:
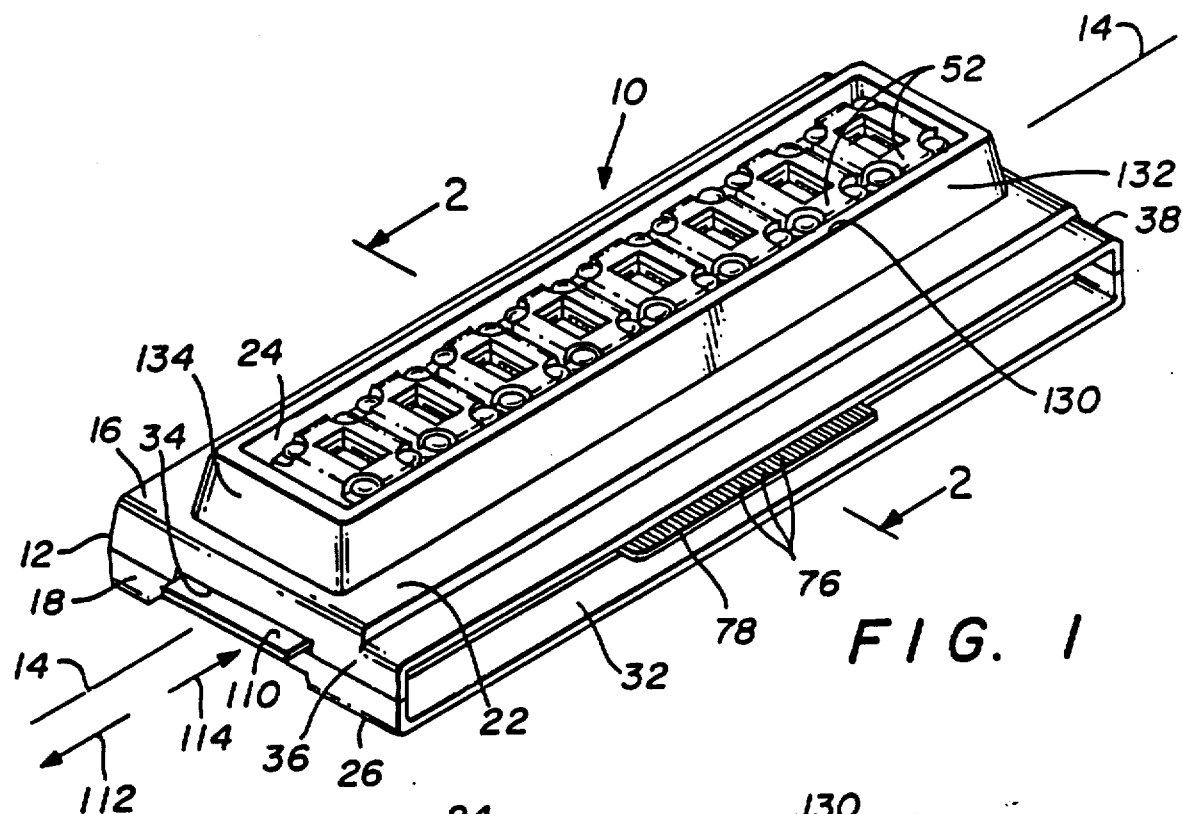
FIG. 1 is an isometric view of an test fixture according to the invention.
Figure 2:
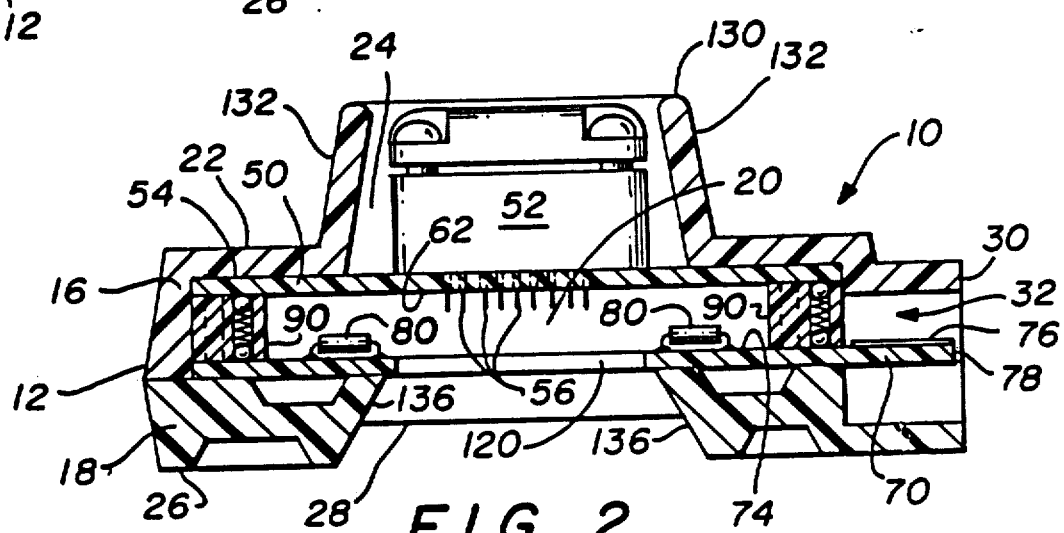
FIG. 2 is a cross-sectional view along plane 2—2 of the test fixture of FIG. 1.
Figure 4:
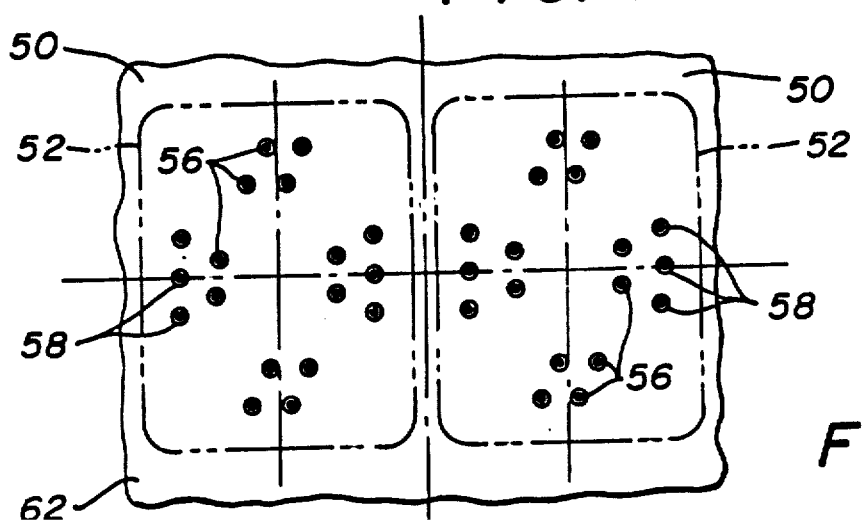
Figure 3:
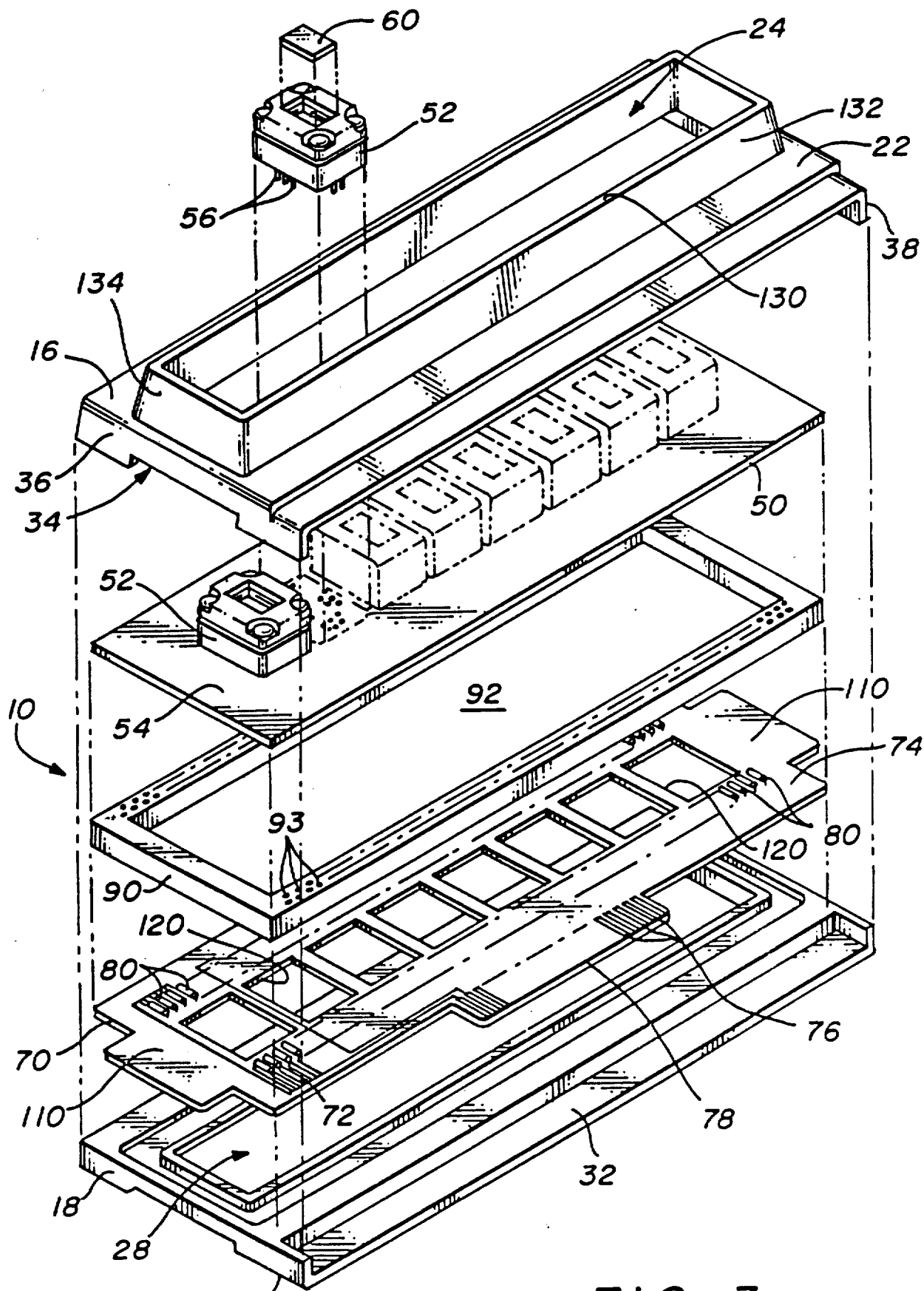
FIG. 3 is an exploded isometric view of the test fixture of FIG. 1.

Referring now to FIGS. 1-3, there is shown test fixture 10 according to the present invention. The test fixture includes body 12 defining longitudinal axis 14. For convenience of manufacture and assembly, the body is contructed of upper section or cap 16 and lower section or base 18 joined together by any suitable means (not shown) such as screws, rivets, adhesives or the like. The body defines cavity 20; upper surface 22 having opening 24; lower surface 26 having opening 28; and one side edge 30 having an opening 32. The body also defines end opening 34 in each end edge 36 and 38 thereof. All of the openings 24, 28, 32 and 34 communicate with cavity 20.

Figure 4:
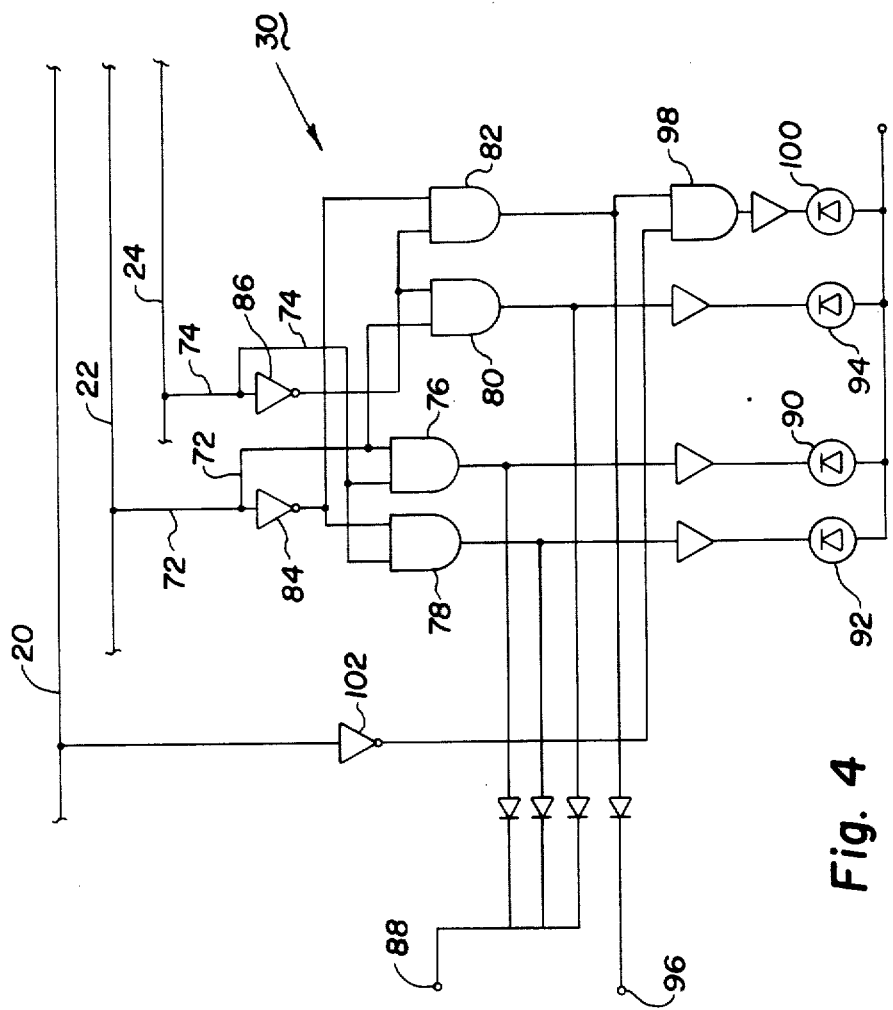
FIG. 4 is a magnified detail view of the leads of zero insertion force sockets mounted in the test fixture.

First printed circuit board 50 is mounted in cavity 20 of the body parallel with longitudinal axis 14. A plurality of sockets 52 are mounted on the upper surface 54 of the first printed circuit board in a longitudinally aligned row. In the illustrated embodiment the sockets are zero or low insertion force sockets such as for leadless chip carriers although other socket designs, whether zero insertion force sockets or not, for other electronic device package types may be employed as well without departing from the spirit and scope of this invention. U.S. Pat. No. 4,491,397, issued Jan. 1, 1985, shows an example of a zero insertion force socket suitable for use with the test fixture of this invention in conjunction with leadless chip carriers. The sockets 52 are secured to the first printed circuit board by inserting and soldering various downwardly depending leads 56 from each of the sockets into aligned preformed holes 58 in the first printed circuit board. The pattern of the exposed ends of the leads extending through the bottom surface 62 of the first printed circuit board 50 is shown in more detail in FIG. 4 in which the various preformed holes 58 are occupied by the leads 56 of the sockets 52 and soldered therein. Each of the sockets is capable of accepting one of the electronic device packages 60 shown in FIG. 3 which, in the illustrated embodiments of the invention, are leadless chip carriers.

Figure 5:
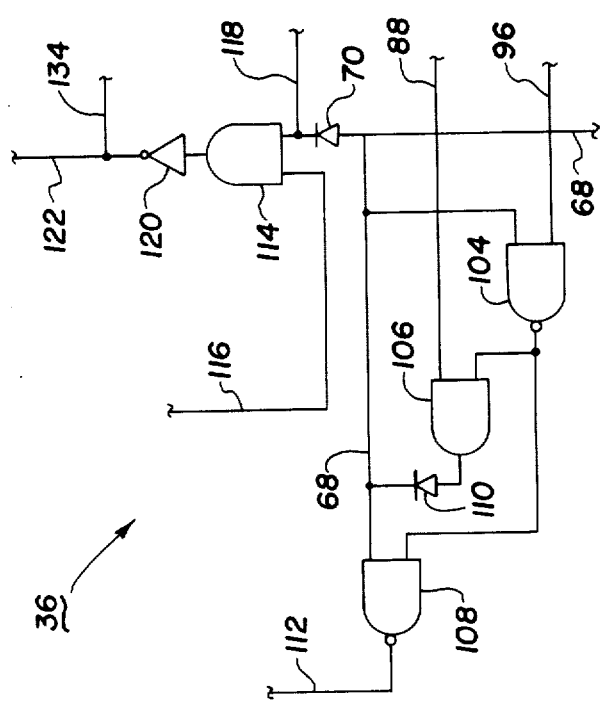
FIG. 5a is a magnified detail view of the connection means of the test fixture of FIG. 1 with the second printed circuit board in a first position.
FIG. 5b is a magnified detail view of the connection means of the test fixture of FIG. 1 with the second printed circuit board in a second position.
Figure 9:
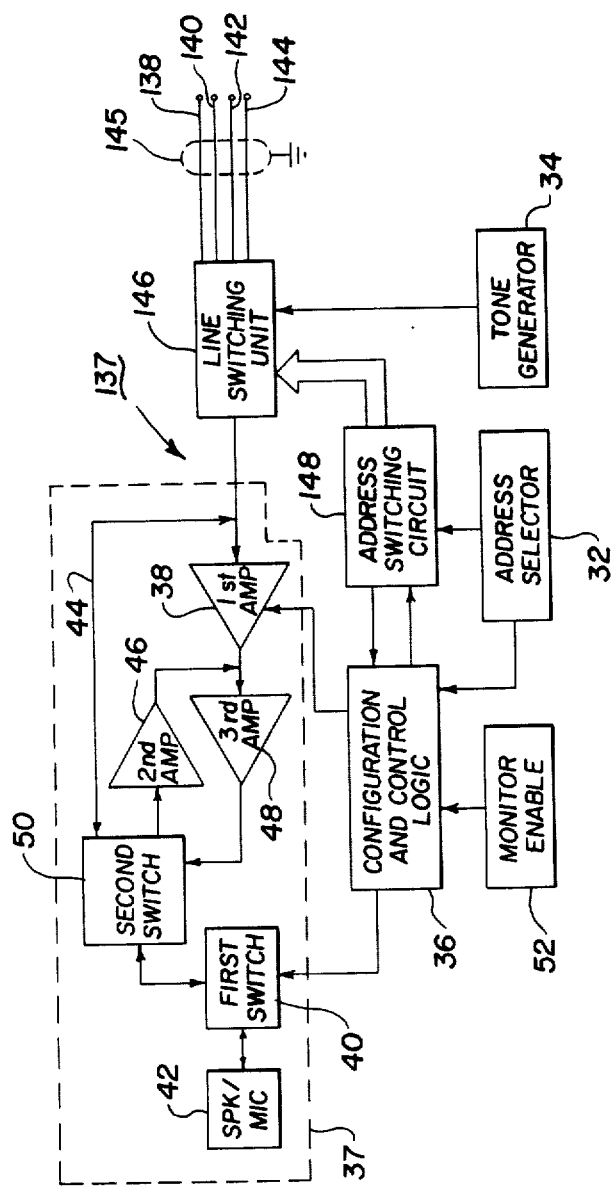
Figure 10:
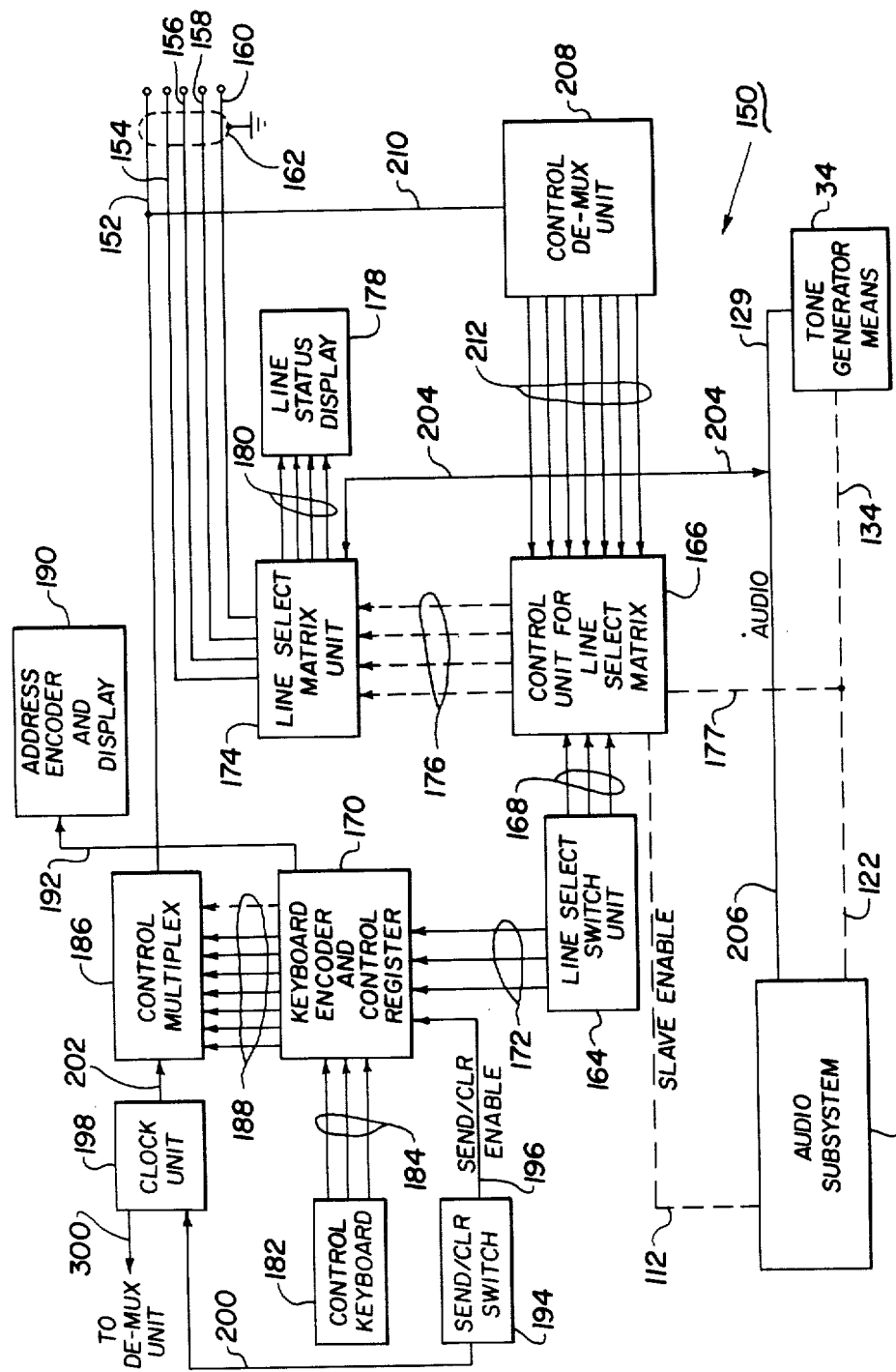
Figure 11:
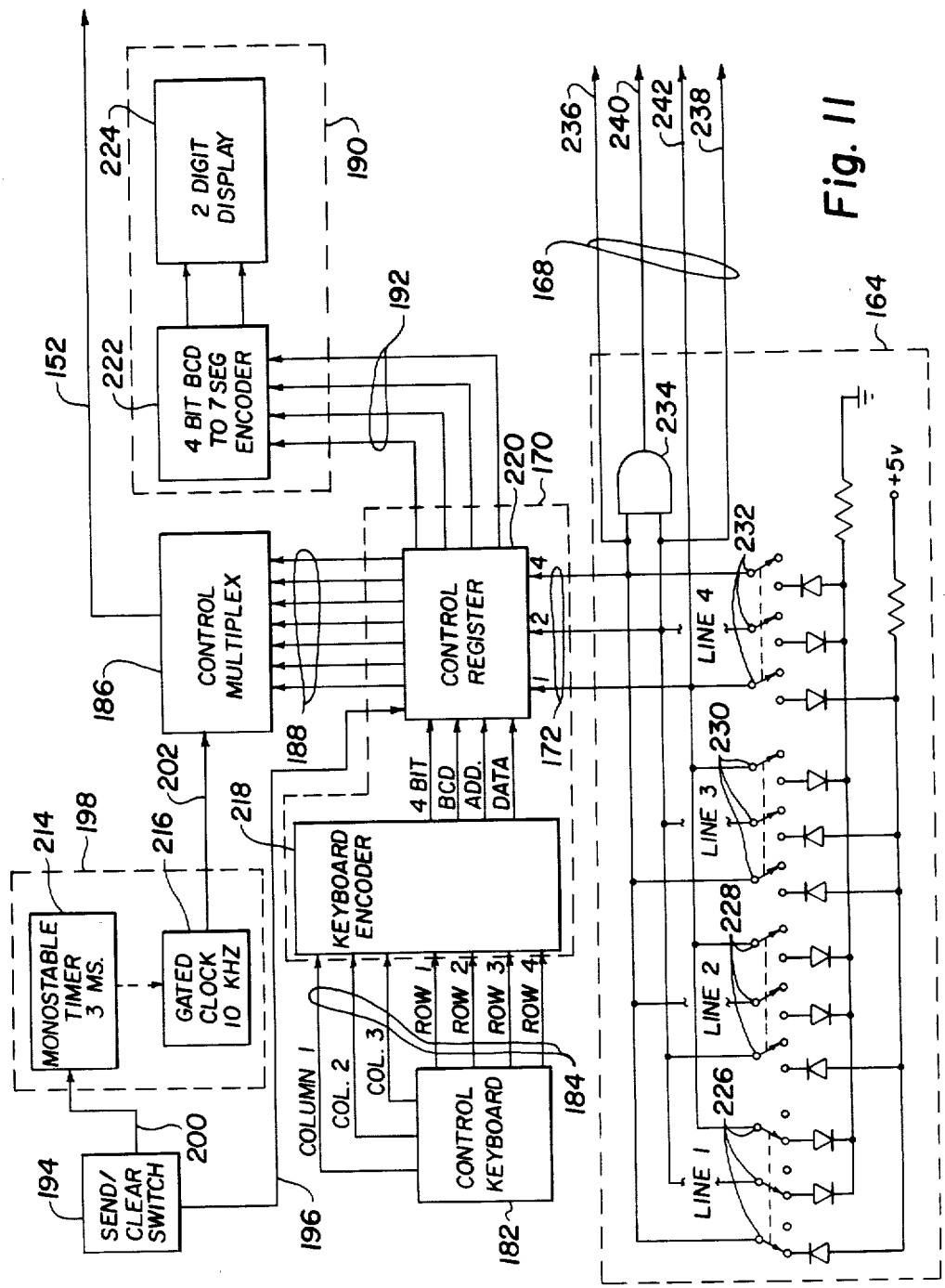
Figure 12:
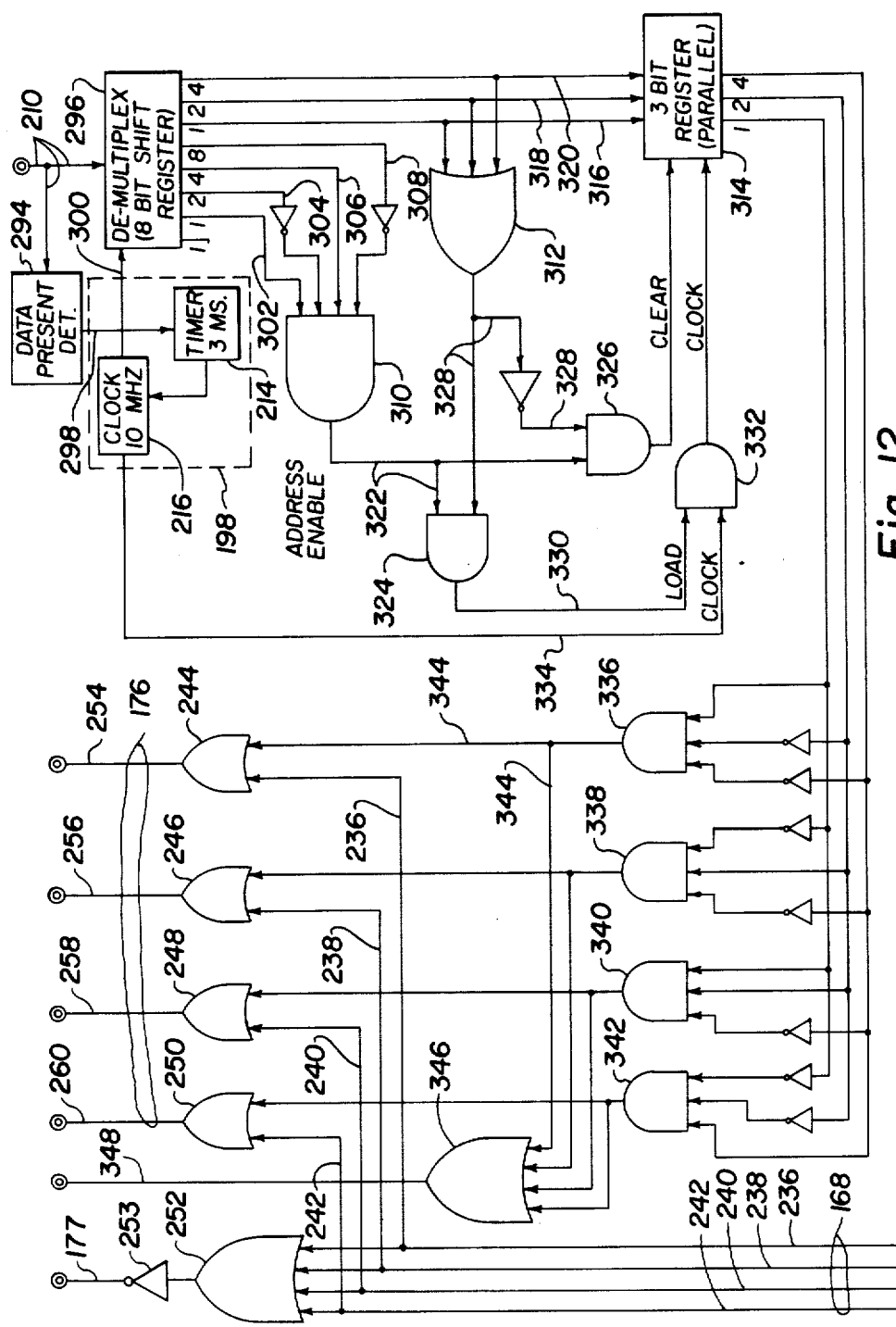
Figure 13:
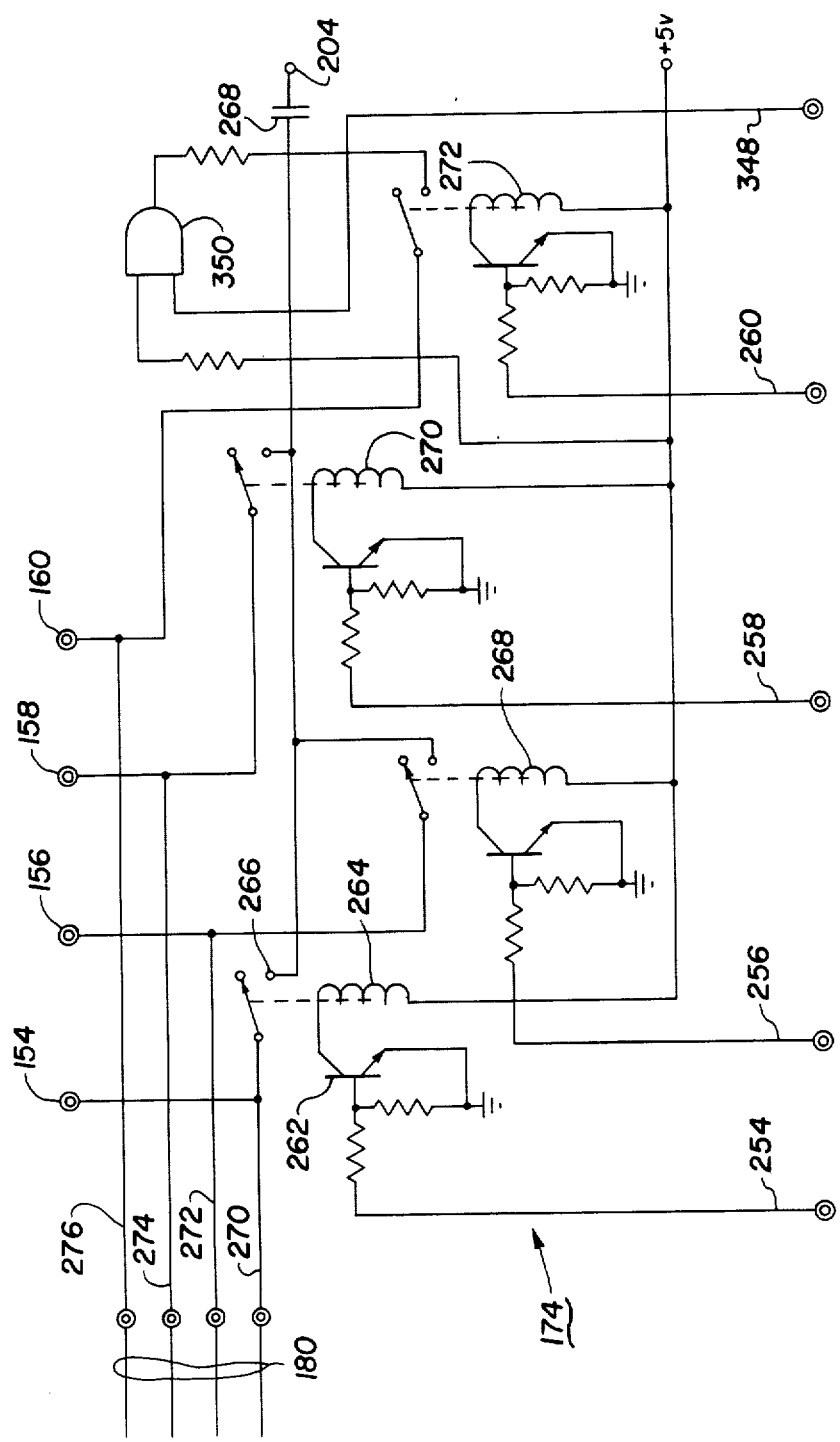
Figure 14:
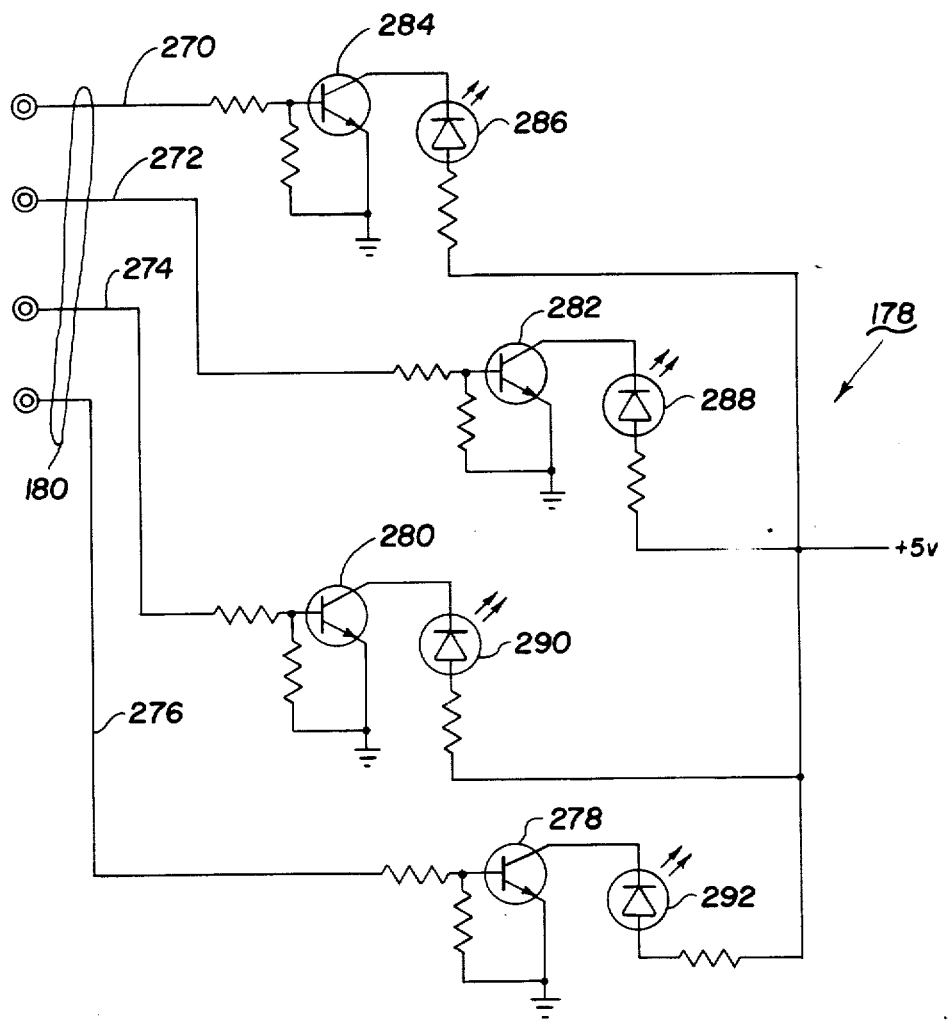

The first printed circuit board includes a first circuit (not shown) having a plurality of conductive circuit paths (not shown) on its upper and lower surfaces extending to and electrically connected to the various preformed holes. The first circuit also includes a plurality of spaced lands 64 (shown in FIGS. 5a and 5b) along at least a portion of either longitudinal side edge on the bottom surface 62. Each of the lands 64 is connected by the first circuit to the sockets 52, thereby enabling each of the socket leads to be connected through the first circuit exteriorly of the first printed circuit board.

A second printed circuit board 70 is mounted in the cavity of the fixture body beneath and parallel with the first printed circuit board parallel with longitudinal axis 14. A plurality of longitudinally spaced conductive lands 72 are formed on the upper surface 74 of the second printed circuit board along at least a portion of either longitudinal edge. The lands 72 are part of a second circuit (not shown) on the second printed circuit board which also includes a plurality of conductive circuit paths (not shown) connecting each of the lands on the second printed circuit board to the lands 76 on an edge connector portion 78 projecting from one edge of the second printed circuit board. The edge connector 78 of the second printed circuit board is accessible exteriorly of the body of the socket through side opening 32 for connection to external test apparatus (not shown). The number, size and spacing of the lands 72 on the second printed circuit board are substantially identical to that of the opposing lands 64 on the bottom surface of the first printed circuit board. A plurality of resistors 80 may be mounted on the second printed circuit board such as by soldering into preformed holes therein. The resistors 80 are connected into the second circuit and each resistor is interposed into one of the circuit paths connecting one of the sockets on the first printed circuit board to the edge connector. Each resistor acts as a barrier to sudden current or voltage increases which could damage the electronic device packages or test apparatus connected to the test fixture, such as if a short circuit is created in the test fixture.

Means are provided to selectively connect the first printed circuit board 50 with the second printed circuit board 70. The connection means includes spacer 90 mounted in cavity 20 of the fixture body and interposed between the first and the second printed circuit boards. The spacer consists of a generally rectangular frame defining opening 92 and includes a plurality of contact members 93 in a pair of parallel staggered rows along either longitudinal side edge of the spacer for connecting the respective circuits on the first and the second printed circuit boards. In the illustrated embodiment the contact members 93 each include an upright passageway 94 extending through the spacer 90. The passageways in each pair of adjacent rows of passageways are offset or staggered from each other. More importantly, the number of longitudinal spacing of the passageways along the length of the spacer are substantially identical to the number and spacing of the lands 64 and 72 on the first and second printed circuit boards, respectively. As is shown in greater detail in FIG. 5a, within each of the passageways is a conductive spring 96 interposed between an upper ball 98 and a lower ball 100. The spring and both balls are constructed of electrically conductive material and, as shown, the springs urge the upper balls 98 and the lower balls 100 in each passageway outwardly in opposite directions 102 and 104, respectively, and into resilient contact with the first and second printed circuit boards, respectively. As shown, each upper ball 98 is aligned and in direct contact with one of the lands 64 on the first printed circuit board.

The second printed circuit board 70 includes handle 110 projecting from at least one end edge thereof. The handle projects at least partially through end opening 34 in the fixture body. The second printed circuit board is shiftable in longitudinal directions 112 and 114 with respect to the fixture body by manipulation of the handle 110. The second printed circuit board may be shifted between a first position and a second position with respect to the fixture body, limited by contact between either end edge of the second printed circuit board and the fixture body at the adjacent end of the cavity. The first and the second positions of the second printed circuit board are separated by a distance less than the distance separating the lands on the first and the second printed circuit board. In the first or connected position (shown in FIG. 5a) the second printed circuit board 70 is shifted in direction 112. The lands 64 and 72, respectively, of the first and the second printed circuit board are vertically aligned with each other and with the passageways 94. Thus the balls 98 and 100 and the springs 96 in each of the passageways electrically interconnect respect aligned lands of the first and second circuits.

If the second printed circuit board 70 is shifted in the opposite longitudinal direction 114 to its second or disconnected position (shown in FIG. 5b), the lands of the second printed circuit board are shifted so that the lower balls 100 contact the upper surface 74 of the second printed circuit board at points intermediate the lands 72 of second printed circuit board, thus interrupting electrical communication between the first and second circuits. In the illustrated embodiment the diameters of the passageways 94, as determined by the size of the balls relative to the width and spacing of the lands 64 and 72, respectively, on the first and second printed circuit boards, requires that the passageways be constructed in two adjacent staggered rows on either longitudinal edge of the spacer. However, it is recognized that the present invention may be constructed with a single linear row of passageways on each longitudinal edge of the spacer if appropriate for a particular printed circuit board design and the number of sockets mounted in the test fixture and lands on the printed circuit boards. By way of example, the lands 64 and 72 might conveniently be 0.025 inch wide with a center-to-center distance between adjacent lands of 0.050 inch. The distance between first and second positions of the second printed circuit board might be selected as 0.025 inch.

The second printed circuit board 70 includes a plurality of apertures 120 formed in a longitudinally aligned row parallel with the row of zero insertion force sockets on the first printed circuit board. The apertures 120 are sized and spaced substantially identical to the sockets and are of equal number therewith. In either the first or second position, the apertures 120 in the second printed circuit board are positioned with respect to the downwardly depending leads 58 of the zero insertion force socket beneath the first printed circuit board to provide access to the leads exteriorly of the fixture body through the bottom opening 28 in the fixture body.

In operation the zero insertion force sockets 52 are each loaded with one electronic device package 60. The semiconductor devices (not shown) contained in the sockets may be individually or collectively tested in various combinations by external test apparatus. The test apparatus is connected to the electronic device packages by inserting one or more conductive probes (not shown) connected to the test apparatus (not shown) through the bottom opening 28 of the fixture body into contact with the exposed leads 56 of the sockets. Once the connection has been established between the probes and the exposed leads of the sockets, the electronic device package may be easily and quickly tested. The probes are retracted from the opening upon completion of the test.

It is within the scope of this invention to provide a circuit on the first printed circuit board which is electrically connected to one or more of the sockets 52 so that contact by a test probe with a land or contact pad on the underside 62 of the first printed circuit board 50 will enable multiple electronic device packages to be connected to the test apparatus for simultaneous testing of the various semiconductor devices contained therein. Other tests, such as the burn-in procedures previously discussed herein, may be simultaneously performed on all the electronic device packages by connecting a conventional edge connector socket (not shown) connected to the external test apparatus to the edge connector 78 of the second printed circuit board. The second printed circuit board is then shifted to its first position, thereby connecting the sockets containing the electronic device packages to the external test apparatus through the first circuit, spacer, contact members, second circuit and the edge connector. Upon completion of the test the edge connector is disconnected from the edge connector socket. The test fixture loaded with the electronic device packages may then be transported, stored or unloaded and then re-loaded with a new set of electronic device packages to be tested, preferably all with the second printed circuit board shifted to its second position to prevent damage to the semiconductor devices such as by static electrical discharge.

The present invention also enables a common burn-in board (not shown) to be constructed for simultaneous testing of multiple test fixtures as herein described. Instead of a plurality of individual sockets mounted directly on the burn-in board, such a burn-in board would be constructed with a printed circuit board connected to an external power source and test apparatus and have a plurality of edge connector sockets mounted at suitable intervals. The edge connector of each test fixture containing the electronic device packages would be quickly and easily engaged to one of the edge connector sockets with the test fixture perpendicular to the surface of the printed circuit board. The printed circuit board would thus receive multiple upright test fixtures for simultaneous testing or burn-in procedures.

The test fixture of the present invention enables a plurality of electronic device packages to loaded into a test fixture as herein described and simultaneously stored, transported and tested without exposing the electronic device packages to repeated insertion and removal from multiple sockets while protecting the electronic device packages from mechanical and/or electrical damage. The present invention also reduces the labor required to store, transport and connect the individual electronic device packages before, during and after test procedures since the packages need only be loaded or unloaded once from the test fixture 10.

Another advantage of the present invention is the ability to compactly store and/or transport a plurality of test fixtures, either unloaded or loaded with electronic device packages. This is accomplished in the illustrated embodiment by ridge 130 formed on the upper surface 16 of the fixture body. The ridge 130 is generally trapezoidal in shape and defines inclined longitudinal sides 132 and inclined ends 134. As shown in FIG. 2, opening 28 in the bottom surface of the fixture body includes inclined longitudinal sides 136 and inclined ends (not shown). The opening 28 of the fixture body is thus constructed to receive the ridge 130 of another substantially identical test fixture body (not shown) with the sides 136 and ends of the opening 28 registering against the adjacent longitudinal sides and ends of the complementary ridge on the lower test fixture. In this manner, a plurality of test fixtures may be vertically stacked in a compact manner prior to or after testing or during transportation between test apparatus.

Figure 6:
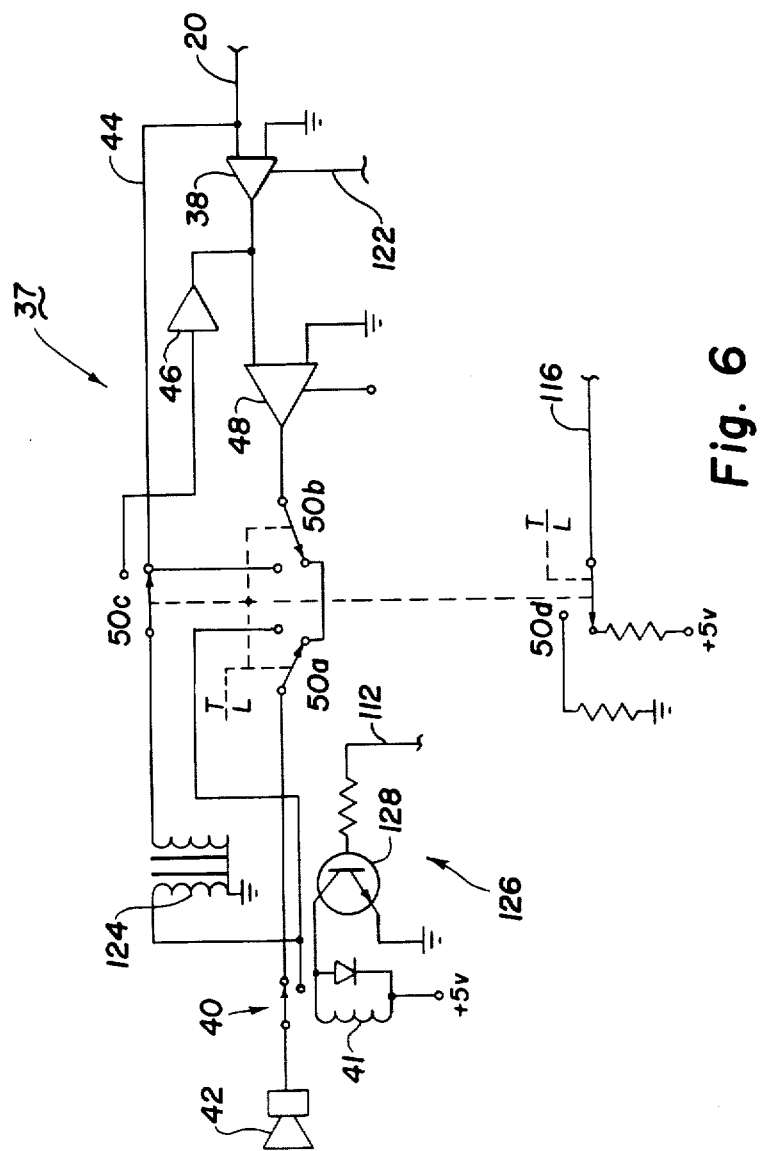
FIG. 6 is an isometric view of an alternative embodiment of the test fixture of this invention.
Figure 8:
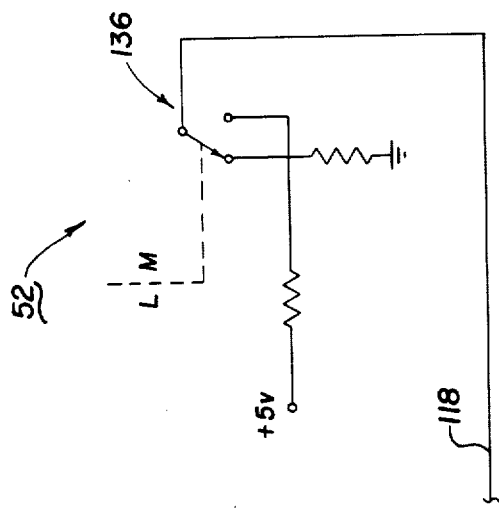

An alternate embodiment of the invention is illustrated in FIGS. 6 and 7. The test fixture shown generally at 160 includes body 162 constructed with an upper section 164 and a lower section 166 joined in any suitable manner. The test fixture body defines cavity 170; upper surface 172 having opening 174; and lower surface 176 having opening 178. Both the openings 174 and 178 communicate with cavity 170. In this embodiment the second printed circuit board is omitted and only first printed circuit board 180 is mounted in the cavity 170 of the fixture body 162. Sockets 182 (similar to sockets 52 in FIGS. 1–5) are mounted on the first printed circuit board 180 and accessible through the upper opening 174 for loading and unloading of electronic device packages 184. The exposed leads (not shown) of the sockets are accessible by probes (not shown) connected to test apparatus (not shown) inserted through the lower opening 178 for testing the electronic device packages individually or in various combinations. In this embodiment the first circuit may also be omitted if desired.

Before or after the test procedures, the test fixtures may be transported or stored with or without electronic device packages loaded into the sockets and, in particular, may be stacked as previously described with respect to the embodiment illustrated in FIGS. 1–5. The test fixture of this embodiment may also include a ridge 186 having inclined side surfaces adapted for insertion into a complementary bottom opening (such as opening 178 in FIG. 7) for stacking the test fixtures in a compact vertical stack. This embodiment of the invention, although omitting the second printed circuit board of the embodiment of FIGS. 1–5, still exhibits the advantages of protecting the electronic device packages and reducing the number of times the electronic device packages are loaded and unloaded from the various test apparatus and burn-in boards. If the printed circuit board 180 includes an appropriate circuit (not shown), the sockets 182 may be connected in such a fashion that the electronic device packages 184 may still be simultaneously tested through test probes connected to the test apparatus and in contact with one or more lands or contact pads (not shown) on the underside of the printed circuit board.

Although the invention has been described above with regard to particular and preferred embodiments, these are advanced for illustrative purposes only and are not intended to limit the scope of this invention. For instance, although the sockets mounted on the first printed circuit board are shown mounted in a single longitudinally aligned row, it is within the spirit of this invention to arrange the sockets in an array of multiple rows and columns if desired. Further, single or multiple sockets may be arranged on the first printed circuit board in any suitable pattern or position as is found advantageous for a particular test, electronic device package or purpose. In the embodiment of the invention illustrated in FIGS. 6 and 7 it is within the scope of this invention to provide the printed circuit board 180 with an edge connector (not shown) and a side opening (not shown) in place of or in conjunction with the bottom opening 178. In that case the printed circuit board includes a circuit (not shown) connecting the sockets to the edge connector and enabling the test fixture to be connected to test equipment through the edge connector. Furthermore, although the invention is illustrated with a stationary spacer having connection means and a second printed circuit board shiftable between connected and disconnected positions with respect to the test fixture and the spacer, it is within the scope of this invention to provide a second printed circuit board which is stationary and a spacer or other connection means shiftable with respect to the second printed circuit board and the test fixture to connect or disconnect the sockets from the test apparatus. These and other variations remain within the scope of the invention as defined by the appended claims.

What is claimed:

1. A test fixture for supporting electronic device packages comprising:
    (a) a test fixture housing having a longitudinal axis and an upper surface defining an opening, a side surface defining an opening, and a cavity communicating with said upper opening and said side opening;
    (b) a first printed circuit board mounted in said cavity parallel with said longitudinal axis supporting a first circuit having a plurality of spaced conductive lands along at least a portion of a longitudinal edge of one surface thereof;
    (c) a plurality of sockets mounted on the upper surface of said first printed circuit board electrically connected to said first circuit;
    (d) a second printed circuit board mounted in said cavity substantially parallel with said first printed circuit board shiftable along said longitudinal axis between a first position and a second position with respect to said housing and supporting a second circuit having a plurality of spaced conductive lands along at least a portion of the longitudinal edge of the surface thereof facing said one surface of said first circuit board, said second circuit including an edge connector accessible through said side opening; and
    (e) contact means mounted intermediate said first printed circuit board and said second printed circuit board having a plurality of conductive contact members mounted therein providing electrical communication between lands on said first printed circuit board and lands on said second printed circuit board only when said second printed circuit board is in a first position.

2. A test fixture as defined in claim 1 wherein each said socket includes one or more leads projecting through the lower surface of said first printed circuit board and further includes a plurality of spaced apertures in said second printed circuit board, each of said apertures aligned with one of said sockets on said first printed circuit board to provide access to the sockets through an opening in a lower surface of said housing.

3. A test fixture as defined in claim 1 wherein each said contact member comprises:
    (a) a passageway extending through said contact means between said first printed circuit board and said second printed circuit board;
    (b) a pair of conductive balls located in said passageway; and
    (c) a conductive spring member located in said passageway interposed between said balls urging each of said balls outwardly from said passageway and into contact with one of said lands of said first and said second circuits when said second printed circuit board is in said first position.

4. A test fixture for supporting electronic device packages comprising:
    (a) a test fixture housing;
    (b) first support means mounted within said housing supporting a plurality of sockets for electronic device packages;
    (c) first circuit means on said first support means electrically interconnected with leads extending from said sockets;
    (d) second support means mounted within said housing;
    (e) second circuit means on said second support means; and
    (f) interconnection means for selectively electrically interconnecting said first circuit means with said second circuit means wherein said interconnection means includes switch means mounted in said housing intermediate said first support means and said second support means shiftable between a first position and a second position and carrying a plurality of contact members, said contact members adapted to provide electrical communication between said first circuit means and said second circuit means when said switch means is in said first position and to prevent electrical communication between said first circuit means and said second circuit means when said switch means in in said second position.

5. A test fixture as defined in claim 4 wherein each said contact member comprises:
   (a) a passageway extending through said switch means;
   (b) a pair of electrically conductive balls located in said passageway; and
   (c) a conductive spring located in said passageway between said balls urging said balls outwardly from said passageway and into contact with one of said first and said second support means.

6. A test fixture for supporting electronic device packages comprising:
   (a) a test fixture housing having a longitudinal axis and including an upper opening and a side opening;
   (b) a first printed circuit board mounted in said housing;
   (c) a plurality of electronic device package sockets mounted on said first printed circuit board accessible through said upper opening for loading and unloading electronic device packages into and from said sockets;
   (d) a second printed circuit board mounted in said housing substantially parallel with said first printed circuit board and shiftable between a first position and a second position with respect to said housing, said second printed circuit board also including means accessible through said side opening for electrically connecting said second printed circuit board to test apparatus; and
   (e) contact means adapted for electrically interconnecting leads extending from said sockets on said first printed circuit board with said second printed circuit board when said second printed circuit board is in said first position and interrupting electrical interconnection between said leads and said second printed circuit board when said second printed circuit board is in said second position.

7. A test fixture as defined in claim 6 wherein said contact means comprises:
   (a) a spacer mounted in said housing intermediate said first printed circuit board and said second printed circuit board; and
   (b) a plurality of contact members, each electrically interconnected with said first circuit board and extending through said spacer means.

8. A test fixture as defined in claim 7 wherein each said contact member comprises:
   (a) a passageway extending through said spacer between said first printed circuit board and said second printed circuit board;
   (b) an electrically conductive ball located in said passageway; and
   (c) and electrically conductive spring located in said passageway interposed between said first circuit board and said ball urging said ball toward said second printed circuit board.

9. A test fixture as defined in claim 6 wherein each of said sockets includes one or more leads projecting through said first printed circuit board and further includes a plurality of spaced apertures in said second printed circuit board, each of said apertures aligned with one of said sockets on said first printed circuit board to provide access to the leads of said sockets through an opening in said housing.

10. A test fixture for supporting electronic device packages comprising:
    (a) a test fixture housing having a longitudinal axis and including an upper opening and a side opening;
    (b) a first printed circuit board mounted in said housing and shiftable between a first position and a second position with respect to said housing;
    (c) a plurality of electronic device package sockets mounted on said first printed circuit board accessible through said upper opening for loading and unloading electronic device packages into and from said sockets;
    (d) a second printed circuit board mounted in said housing substantially parallel with said first printed circuit board, said second printed circuit board also including means accessible through said side opening for electrically connecting said second printed circuit board to test apparatus; and
    (e) contact means adapted for electrically interconnecting leads extending from said sockets on said first printed circuit board with said second printed circuit board when said first printed circuit board is in said first position and interrupting electrical interconnection between said leads and said second printed circuit board when said first printed circuit board is in said second position.

* * * * *

UNITED STATES PATENT AND TRADEMARK OFFICE
CERTIFICATE OF CORRECTION

PATENT NO.   : 4,767,983

DATED        : Aug. 30, 1988

INVENTOR(S)  : Wayne K. Pfaff

It is certified that error appears in the above-identified patent and that said Letters Patent is hereby corrected as shown below:

The title page should be deleted to appear as per attached title page.

Figure 1-14 of the drawings should be deleted to be replaced with figures 1-7 as shown on the attached sheets.

Signed and Sealed this

Eighth Day of August, 1989

Attest:

DONALD J. QUIGG

Attesting Officer

Commissioner of Patents and Trademarks

United States Patent [19]
Pfaff

[11] Patent Number: 4,767,983
[45] Date of Patent: Aug. 30, 1988

[54] TEST FIXTURE FOR ELECTRONIC DEVICE PACKAGES

[76] Inventor: Wayne K. Pfaff, 309 Steeplechase, Irving, Tex. 75062

[21] Appl. No.: 421

[22] Filed: Jan. 5, 1987

[51] Int. Cl.⁴ .............................................. G01R 31/02
[52] U.S. Cl. ............................ 324/158 F; 324/73 PC
[58] Field of Search ............. 324/158 F, 73 PC, 73 R; 200/16 C, 16 D, 11 DA; 439/78, 79, 80

[56] References Cited

U.S. PATENT DOCUMENTS

| | | | |
|---|---|---|---|
| 2,853,565 | 9/1958 | Arthur et al. | 200/16 D |
| 4,152,644 | 5/1979 | Lockhart, Jr. | 324/158 F |
| 4,468,616 | 8/1984 | Yoshizaki | 324/158 F |
| 4,514,786 | 4/1985 | Charruau | 324/73 PC |
| 4,636,725 | 1/1987 | Santomango et al. | 324/158 F |

*Primary Examiner*—Ernest F. Karlsen
*Attorney, Agent, or Firm*—Kanz, Scherback Timmons

[57] ABSTRACT

Disclosed is a test fixture for connecting a plurality of electronic device packages to test apparatus. The fixture includes a plurality of test sockets and means to selectively interconnect the socket leads with external test apparatus. The test fixture may be used as a burn-in board as well as a test, transport and storage medium to reduce individual handling of electronic device packages.

10 Claims, 11 Drawing Sheets

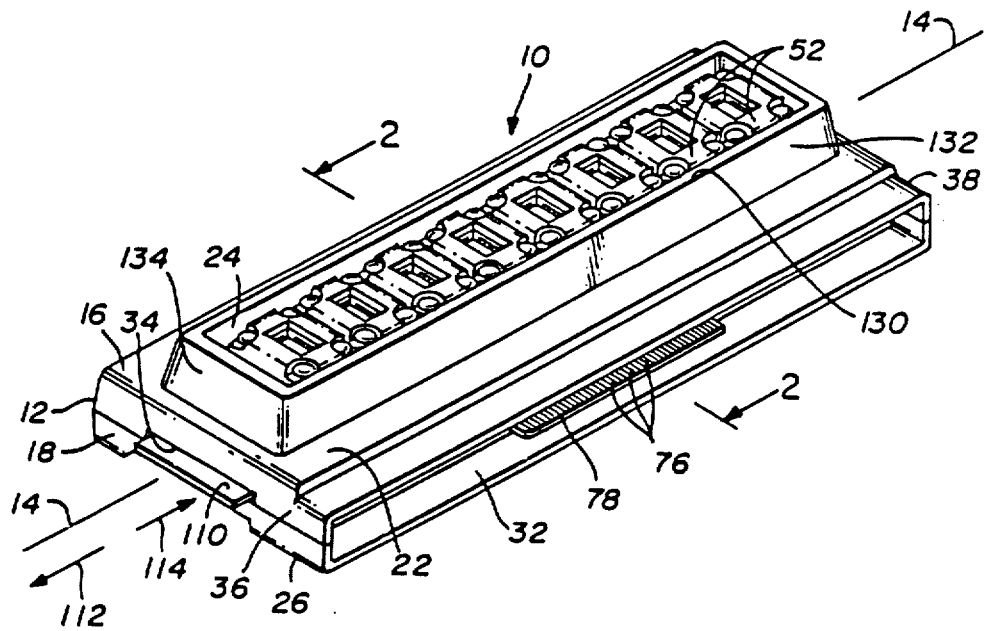

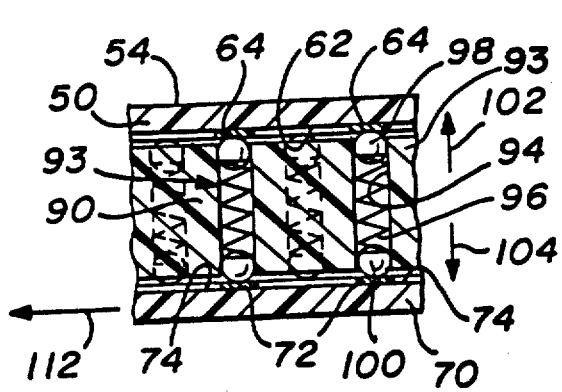
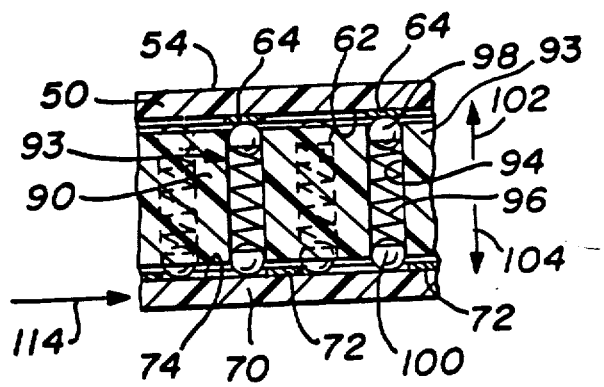
FIG. 5a  FIG. 5b
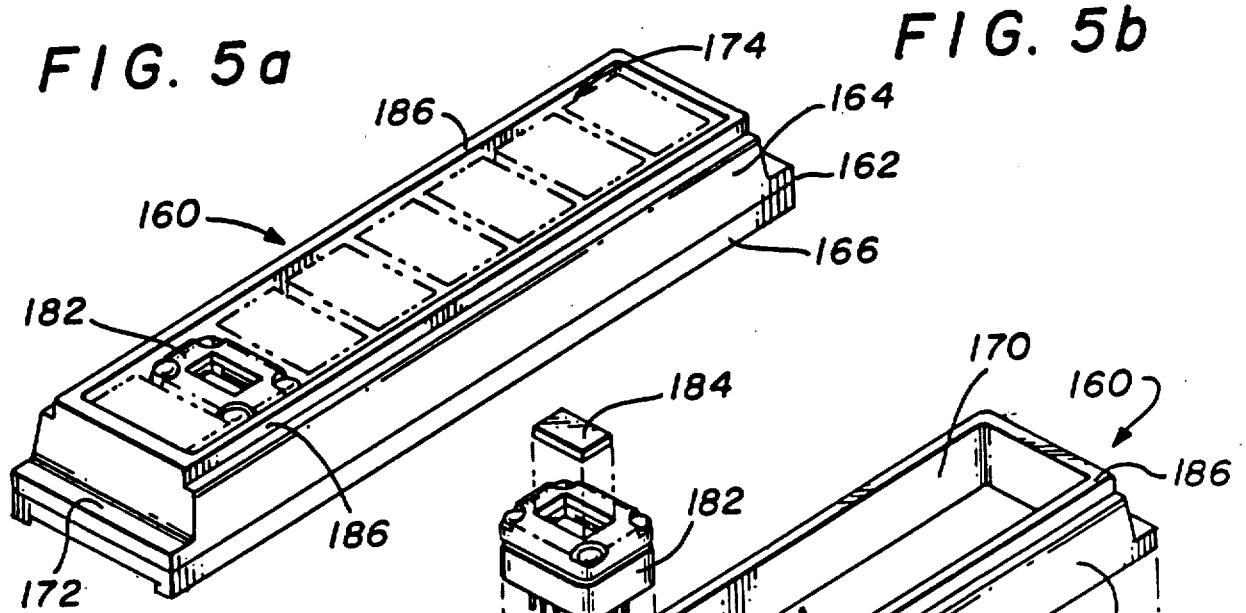
FIG. 6
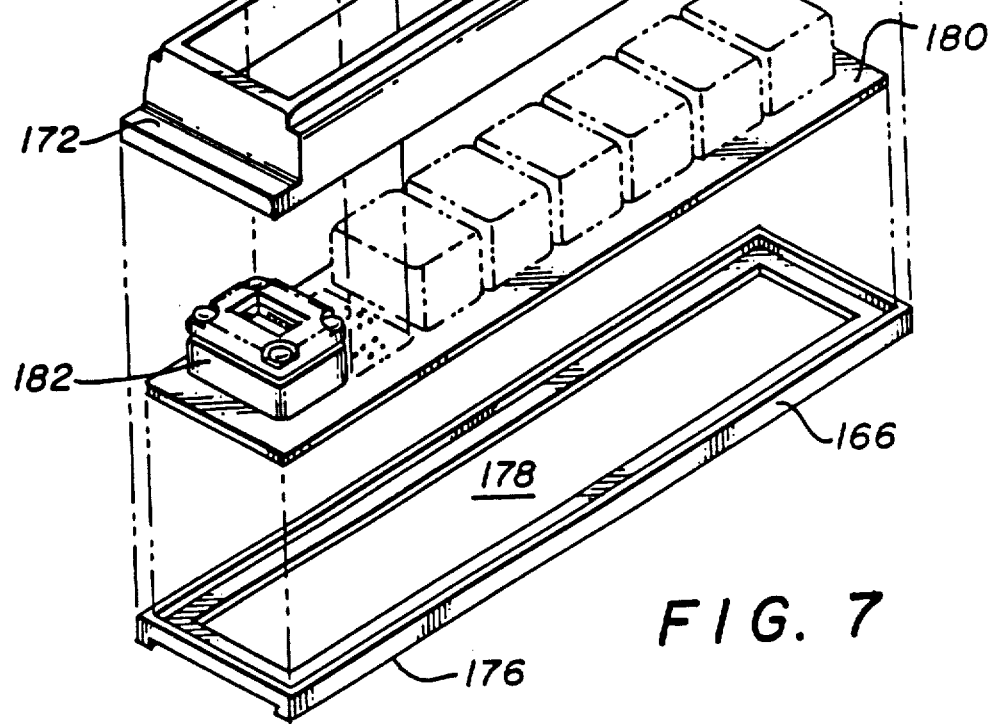
FIG. 7